US010338850B2

(12) United States Patent
Rose

(10) Patent No.: US 10,338,850 B2
(45) Date of Patent: Jul. 2, 2019

(54) SPLIT-PAGE QUEUE BUFFER MANAGEMENT FOR SOLID STATE STORAGE DRIVES

(71) Applicant: Toshiba Memory Corporation, Minato-ku, Tokyo (JP)

(72) Inventor: Philip Rose, Islip (GB)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/702,135

(22) Filed: Sep. 12, 2017

(65) Prior Publication Data
US 2019/0079696 A1     Mar. 14, 2019

(51) Int. Cl.
G06F 11/10     (2006.01)
G06F 3/06      (2006.01)
G11C 29/52     (2006.01)

(52) U.S. Cl.
CPC .......... G06F 3/0659 (2013.01); G06F 3/0604 (2013.01); G06F 3/0656 (2013.01); G06F 3/0688 (2013.01); G06F 11/1068 (2013.01); G11C 29/52 (2013.01)

(58) Field of Classification Search
CPC . H04L 47/2441; G06F 3/0604; G06F 3/0656; G06F 3/0688
See application file for complete search history.

(56) References Cited

U.S. PATENT DOCUMENTS

| 5,202,999 A *    | 4/1993 | Lenthall ............... G06F 13/37 710/244 |
| 9,270,296 B1 *   | 2/2016 | Nemati Anaraki ........................ G06F 11/1008 |
| 2007/0016637 A1* | 1/2007 | Brawn ............... H04L 47/2441 709/200 |
| 2008/0215800 A1* | 9/2008 | Lee ....................... G06F 3/0613 711/103 |

(Continued)

Primary Examiner — Ryan Bertram
Assistant Examiner — Trang K Ta
(74) Attorney, Agent, or Firm — White & Case LLP

(57) ABSTRACT

In one embodiment, a solid state storage drive comprises a plurality of flash memory devices configured to store a plurality of data clusters having a predefined data cluster size, and configured to store a first part of a first data cluster of the plurality of data clusters on a first page of flash memory and a second part of the first data cluster on a second page of flash memory, a partial buffer completion bitmap stored in a memory, wherein each bit in the partial buffer completion bitmap corresponds to a location in a buffer configured to receive data clusters read from the plurality of flash memory devices, and a controller configured to cause a page of data to be read from one of the plurality of flash memory devices, the page of data including either the first part of the first data cluster or the second part of the first data cluster, the controller including a queue buffer manager configured to change the status of a bit in the partial buffer completion bitmap when either the first part of the first data cluster or the second part of the first data cluster has been read from either the first page or the second page of flash memory and stored in the buffer. In one embodi- (Continued)

ment, the plurality of flash memory devices is further configured to store a first part of a second data cluster on the second page of flash memory and a second part of the second data cluster on a third page of flash memory.

20 Claims, 8 Drawing Sheets

(56) References Cited

U.S. PATENT DOCUMENTS

| | | | |
|---|---|---|---|
| 2010/0017573 A1* | 1/2010 | Shinozaki | G06F 11/1662 |
| | | | 711/162 |
| 2015/0356033 A1 | 12/2015 | Rose et al. | |
| 2017/0139768 A1* | 5/2017 | Camp | G06F 11/108 |
| 2017/0212692 A1* | 7/2017 | Camp | G06F 3/0611 |

* cited by examiner

| | 00 | 01 | 02 | 03 | 04 | ... | 1021 | 1022 | 1023 |
|---|---|---|---|---|---|---|---|---|---|
| 216 | 2 | 1 | 0 | 0 | 11 | | 4 | 1 | 2 |
| 214 | 4 | 7 | 9 | 6 | 0 | | 5 | 9 | 7 |
| | ... | | | | | | | | |
| | 0 | 0 | 0 | 1 | 1 | | 0 | 0 | 0 |
| | 1 | 0 | 0 | 1 | 1 | | 0 | 0 | 0 |
| | 0 | 0 | 0 | 1 | 1 | | 0 | 1 | 0 |
| | 1 | 0 | 0 | 0 | 1 | | 0 | 0 | 0 |
| | 0 | 1 | 0 | 0 | 1 | | 1 | 0 | 1 |
| | 1 | 0 | 0 | 1 | 1 | | 1 | 0 | 0 |
| | 1 | 1 | 0 | 0 | 1 | | 0 | 0 | 0 |
| | 1 | 1 | 1 | 0 | 1 | | 1 | 0 | 1 |
| | 0 | 0 | 1 | 0 | 1 | | 1 | 0 | 0 |
| 212 | 1 | 0 | 0 | 1 | 1 | | 1 | 0 | 1 |
| | 1 | 1 | 0 | 0 | 1 | | 1 | 1 | 1 |

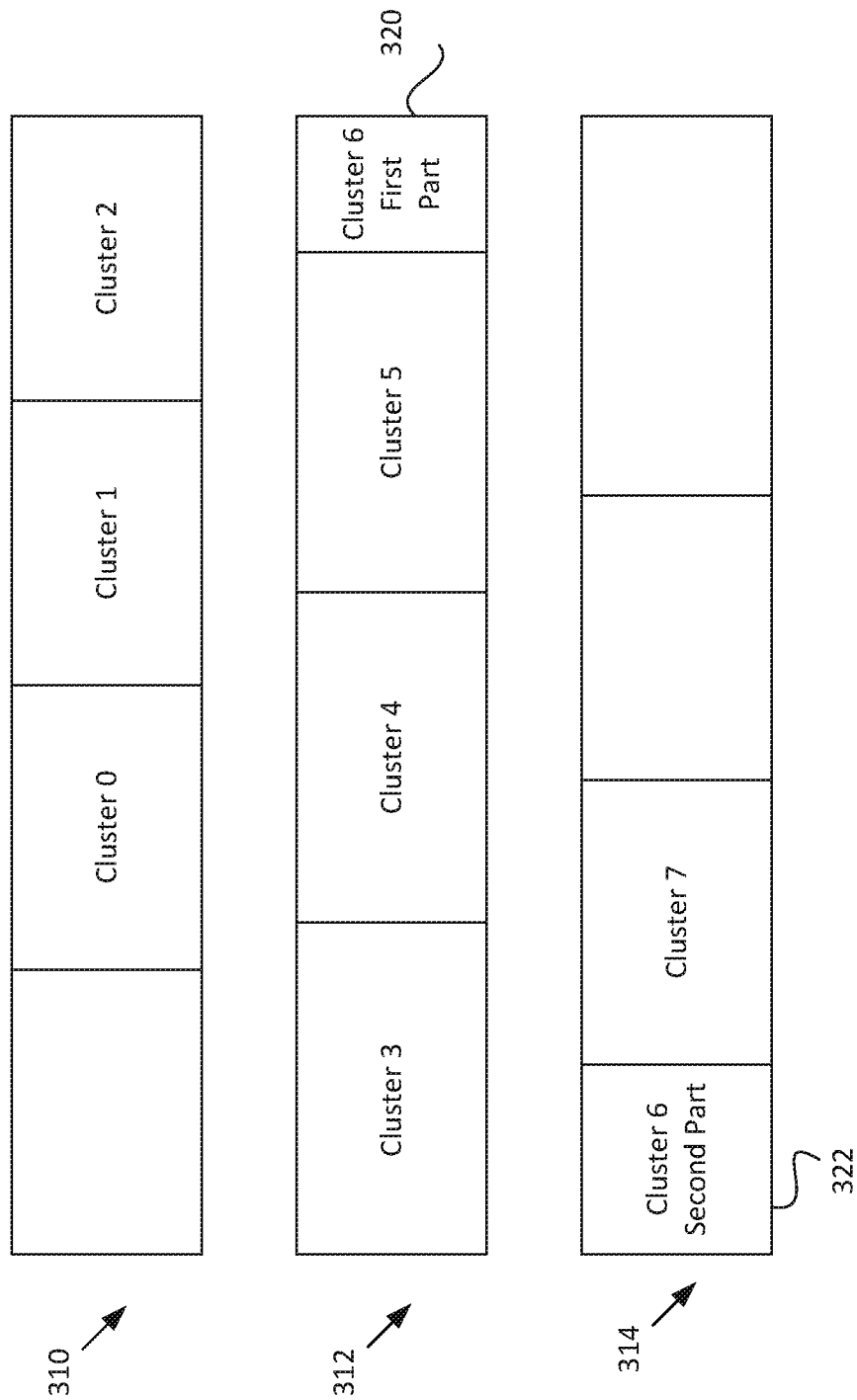

| EQ Index | Partial Buffer Offset | Partial Buffer Count |
|---|---|---|
| 1 | 0 | 5 |

510

| EQ Index | Partial Buffer Offset | Partial Buffer Count |
|---|---|---|
| 1 | 6 | 6 |

512

| EQ Index | Partial Buffer Offset | Partial Buffer Count |
|---|---|---|
| 1 | 13 | 2 |

SPLIT-PAGE QUEUE BUFFER MANAGEMENT FOR SOLID STATE STORAGE DRIVES

FIELD OF THE INVENTION

The invention relates generally to solid state storage drives and more particularly to split page queue buffer management for solid state storage drives.

BACKGROUND

Non-volatile memory (NVM) is a type of computer memory that retains stored information even after power cycling—powering a device off and then on again. In contrast, volatile memory is a type of computer memory that requires power to maintain the stored information—when the power is off or interrupted, the stored data is lost. A traditional type of non-volatile memory is a hard disk drive (HDD), which stores and accesses data using one or more rotating disks (platters) coated with magnetic material.

Another type of storage memory is a solid state drive (SSD), which differs from a HDD in that digital data is stored and retrieved using electronic circuits, without any moving mechanical parts. SSDs can be used based on both volatile memory, such as dynamic random-access memory (DRAM) or static random access memory (SRAM), or non-volatile memory, such as NAND flash memory. The standard NAND flash memory can be Single Level Cell (SLC) or Multi Level Cell (MLC), including enterprise MLC (eMLC), Triple Level Cell (TLC) and Quadratic Level Cell (QLC).

NAND flash memory devices typically apply error correction coding to data before it is stored. Error correction coding (ECC) is used to reduce bit errors in the data read from the memory device. Data is stored in and read from NAND flash memory devices in units of pages, and operating system file systems organize data in units of data clusters, such as 4 KB clusters. For example, a page in a NAND flash memory device might be nominally 16 KB but has some extra storage capacity or spare area, such as an extra 2 KB. In some cases, this spare area is sufficient to store the additional bits generated by error correction coding of the data being stored such that four 4 KB data clusters and the error correction bits for that user data can be stored in a single nominal 16 KB page. Higher-density NAND memory devices such as TLC and QLC typically have higher bit error rates, and thus require robust error correction coding. Robust error correction coding may also be used in NAND flash SSDs that are warrantied to satisfy a high performance criteria for a certain period of time, for example 100 GB of data writes per day (1 DWPD) for three years. In cases where strong error correction coding is applied, a 2 KB spare area of a nominal 16 KB flash page cannot always store the number of required error correction bits and so some of those error correction bits are stored in the user data area of the flash page. In such a situation four 4 KB clusters of user data and the error correction bits can no longer fit within a single page of NAND flash memory.

One possible technique addressing this problem would be to store the integer number of full data clusters) and all error correction bits for that data that can fit within one nominal 16 KB page of flash memory and leave any remaining portion of the page empty. But leaving portions of flash memory pages intentionally unused is inefficient and would result in the NAND flash SSD not meeting its capacity rating. Thus there is a need for a technique for efficiently managing the storage and retrieval of data with robust error correction coding in NAND flash memory devices.

BRIEF DESCRIPTION OF THE INVENTION

In one embodiment, a solid state storage drive comprises a plurality of flash memory devices configured to store a plurality of data clusters having a predefined data cluster size, and configured to store a first part of a first data cluster of the plurality of data clusters on a first page of flash memory and a second part of the first data cluster on a second page of flash memory, a partial buffer completion bitmap stored in a memory, wherein each bit in the partial buffer completion bitmap corresponds to a location in a buffer configured to receive data clusters read from the plurality of flash memory devices, and a controller configured to cause a page of data to be read from one of the plurality of flash memory devices, the page of data including either the first part of the first data cluster or the second part of the first data cluster, the controller including a queue buffer manager configured to change the status of a bit in the partial buffer completion bitmap when either the first part of the first data cluster or the second part of the first data cluster has been read from either the first page or the second page of flash memory and stored in the buffer. The queue buffer manager is configured to change the status of the bit in the partial buffer completion bitmap by performing an exclusive OR operation on the current value of the bit and a logic one value and storing the result as the updated value of the bit. The queue buffer manager is further configured to determine that both the first part of the first data cluster and the second part of the first data cluster have been read from the plurality of flash memory devices when a value of an updated bit in the partial buffer completion bitmap corresponds to a predetermined value. In one embodiment, the plurality of flash memory devices is further configured to store a first part of a second data cluster on the second page of flash memory and a second part of the second data cluster on a third page of flash memory.

In one embodiment, a method comprises reading a first page of data from one of a plurality of flash memory devices, the first page of data including either a first part of a first data cluster or a second part of the first data cluster, wherein the plurality of flash memory devices is configured to store a plurality of data clusters having a predefined data cluster size, detecting a read completion for the first page of data read from the flash memory device, determining that the first page of data read from the flash memory device includes either the first part of the first data cluster or the second part of the first data cluster, and changing the status of a bit in a partial buffer completion bitmap, wherein each bit in the partial buffer completion bitmap corresponds to a location in a buffer configured to receive data clusters read from the plurality of flash memory devices. In one embodiment, changing the status of the bit in the partial buffer completion bitmap comprises performing an exclusive OR operation on the current value of the bit and a logic one value and storing the result as the updated value of the bit. In one embodiment, the method further comprises determining that both the first part of the first data cluster and the second part of the first data cluster have been read from one or more of the plurality of flash memory devices when a value of an updated bit in the partial buffer completion bitmap corresponds to a predetermined value. In one embodiment, the first page of data includes the second part of the first data cluster and a first part of a second data cluster of the plurality of data clusters.

BRIEF DESCRIPTION OF THE DRAWINGS

FIG. 2 is a diagram of one embodiment of a queue buffer management bitmap, according to the invention.

FIG. 3A is a diagram showing clusters of data stored in three pages of NAND flash memory, according to one embodiment of the invention.

FIG. 5 is a diagram showing the contents of queue buffer management registers, according to one embodiment of the invention.

DETAILED DESCRIPTION OF THE INVENTION

Figure 1:
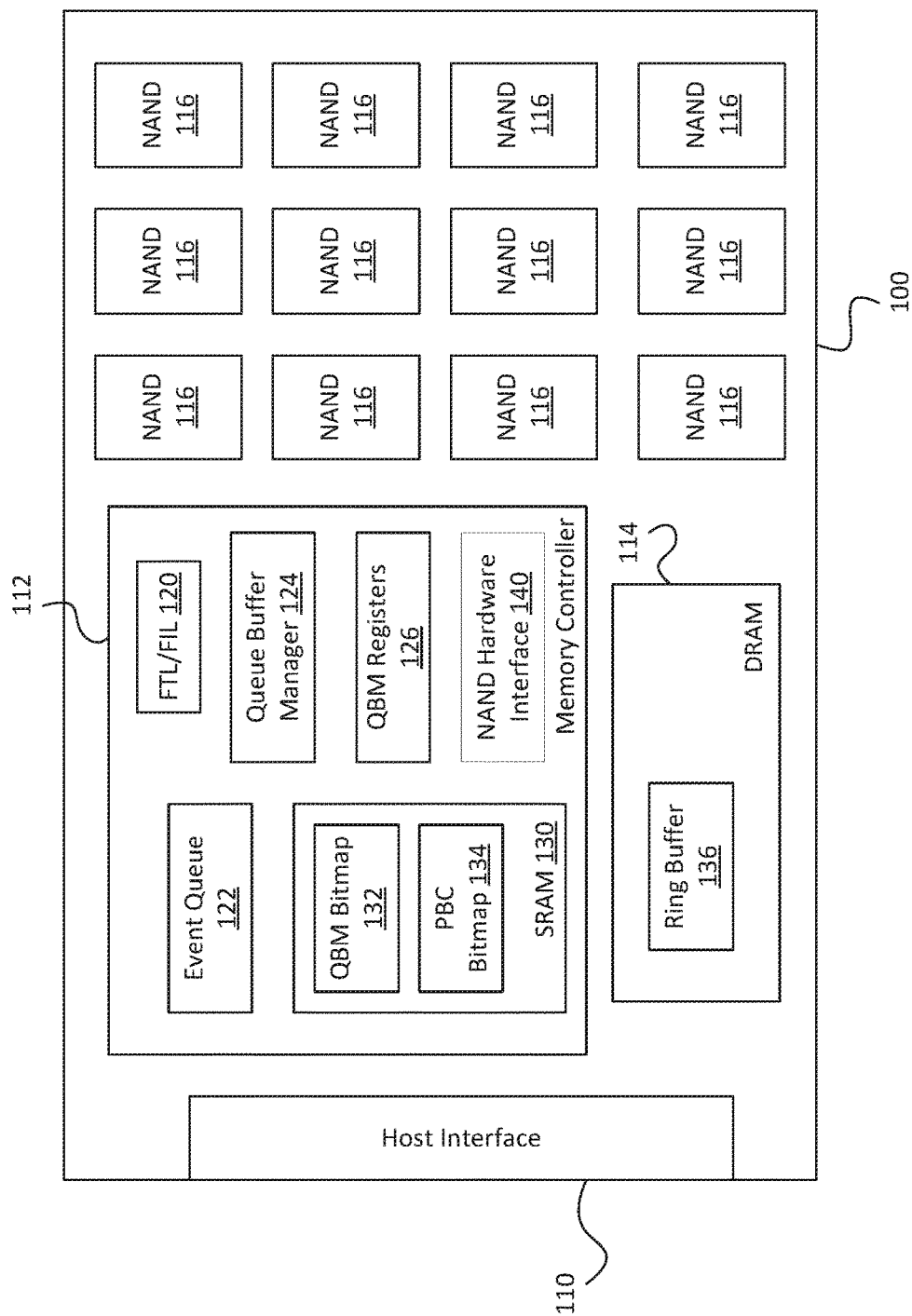
FIG. 1 is a diagram of one embodiment of a solid state storage device, according to the invention.

FIG. 1 is a block diagram of one embodiment of a solid state storage drive 100, according to the invention. Solid state storage drive 100 includes, but is not limited to, a host interface 110, a memory controller 112, a DRAM 114, and a plurality of NAND flash memory devices 116. Host interface 110 enables solid state storage drive 100 to communicate with a host device (not shown). In one embodiment, host interface 110 is a PCIe connector that can be coupled to a PCIe bus (not shown) of an enterprise server or other computing system host using, for example, an NVMe protocol. Other hardware connection types (for example SATA) and other protocols (for example SCSI) are within the scope of the invention. Memory controller 112 includes, but is not limited to, a Flash Translation Layer/Flash Interface Layer (FTL/FIL) 120, an event queue 122, a queue buffer manager 124, queue buffer management (QBM) registers 126, an SRAM 130, and a NAND hardware interface 140. SRAM 130 includes, but is not limited to, a queue buffer management (QBM) bitmap 132 and a partial buffer completion (PBC) bitmap 134. DRAM 114 includes, but is not limited to, a ring buffer 136. In other embodiments, QBM bitmap 132 and PBC bitmap 134 are stored in DRAM 114. Although twelve NAND devices 116 are shown in FIG. 1, a solid state storage drive 100 having any number of NAND devices 116 is within the scope of the invention.

Host interface 110 forwards data read commands from the host to event queue 122. FTL/FIL 120 is firmware that processes each read command in event queue 122. FTL/FIL 120 maps logical block addresses provided by the host in the read command to physical block addresses in one or more of NAND devices 116 and creates one or more read events to read one or more pages of data from NAND devices 116. For example, a read command from the host may call for the retrieval of a 32 kilobyte (KB) block of data and each of NAND devices 116 supports one 16 KB page of data per read operation. In such a case, FTL/FIL 120 will translate the 32 KB read command into a number of 16 KB page read events. FTL/FIL 120 manages data in 4 KB clusters. The 32 KB block of data identified in the host read command is organized as eight 4 KB clusters and FTL/FIL 120 identifies the appropriate 16 KB pages where those eight clusters are located in NAND devices 116. NAND hardware interface 140 reads the identified pages from one or more of NAND devices 116, error correction decodes the retrieved data, and places the decoded data into ring buffer 136 using a direct memory access (DMA).

Ring buffer 136 includes a plurality of buffer portions where each portion is configured to store one 4 KB cluster of data. FTL/FIL 120 allocates an appropriate number of 4 KB portions in ring buffer 136 for each read command sent to NAND hardware interface 140. Ring buffer 136 stores each 4 KB cluster of data returned from NAND devices 116 until all the clusters corresponding to a particular host read command have been returned. Queue buffer manager 124, which in one embodiment is a hardware-based state machine, tracks completion of host read commands by setting bits in QBM bitmap 132. QBM bitmap 132 is a record of completion of each 4 KB cluster access (read) that is required to fulfill a read command from the host. When all clusters of the data called for by the read command from the host have been stored in ring buffer 136, FTL/FIL 120 sends the read command to a completion queue of the host (not shown) to indicate to the host that the data is available in ring buffer 136. Queue buffer manager 124 also tracks completion of retrieval of partial clusters from NAND devices 116 using PBC bitmap 134, which is discussed below in conjunction with FIGS. 3-7.

FIG. 2 is a diagram of one embodiment of QBM bitmap 132, according to the invention. Each row of QBM bitmap 132, such as a row 210, represents an outstanding read command from the host. In the case of a SATA host interface there may be up to 32 outstanding commands, and in the case of a PCIe host interface, there may be up to 65,535 separate command queues with up to 64K queued commands each. FIG. 2 shows QBM bitmap 132 as including 1024 rows representing 1024 outstanding read commands; however, any appropriate number of rows corresponding to a number of outstanding read commands is within the scope of the invention. A plurality of columns, such as column 212, represents the maximum number of 4 KB clusters one read command can include. For example, in one embodiment a host read command can request from 1 to 1024 4 KB clusters of data to be read from NAND devices 116, so each row of QBM bitmap 132 includes 1024 bits to track read completions; however, any number of columns in QBM bitmap 132 is within the scope of the invention. The value of the bit at the intersection of row 210 and column 212 indicates whether or not a particular 4 KB cluster of data has been stored in ring buffer 136 for that particular outstanding command. A value of "1" in QBM bitmap 132 indicates that the data cluster has been read from NAND devices 116 and placed in ring buffer 136, and a value of "0" in QBM bitmap 132 indicates that the data cluster has not yet been read from NAND devices 116 and placed in ring buffer 136. A column 214 stores a number of clusters outstanding for each outstanding read command, and a column 216 stores a number of consecutive clusters from the start of the assigned ring buffer 136. Embodiments of QBM bitmap 132 are further disclosed in U.S. Patent Application Publication No. 2015/0356033, the subject matter of which is hereby incorporated by reference in its entirety.

FIG. 3A is a diagram showing clusters of data stored in three pages of NAND memory, according to one embodiment of the invention. For a read command calling for the retrieval of 32 KB of data, that data may be stored within three pages of NAND memory as shown in FIG. 3A. The ECC bits for each page of data, which in the FIG. 3A embodiment are stored in the spare area and may also be stored in the user data area of the page, are not shown for ease of illustration. A first NAND page 310 includes the first three 4 KB clusters (cluster 0, cluster 1, and cluster 2) of the requested data. A second NAND page 312 includes another three clusters of data (cluster 3, cluster 4, and cluster 5) and a portion of a fourth cluster of data (cluster 6 first part 320). In other words, NAND page 312 includes three full clusters and one partial cluster. A third NAND page 314 includes one partial cluster (cluster 6 second part 322) and one full cluster (cluster 7). NAND pages 310, 312, and 314 may be sequential pages in a single NAND device 116 or may be non-sequential pages stored in one or more NAND devices 116. For example, NAND page 312 containing cluster 6 first part 320 and NAND page 314 containing cluster 6 second part 322 may be located in different NAND devices 116. Cluster 6 first part 320 and cluster 6 second part 322 together include all of the user data for cluster 6 and that information can be divided between the two partial clusters in any appropriate fashion. For example, cluster 6 first part 320 may contain 3.5 KB of user data and cluster 6 second part 322 may contain the remaining user data of cluster 6. In another example, cluster 6 first part 320 may contain 20 bytes of user data and cluster 6 second part 322 contains the remaining data of cluster 6.

Figure 3B:
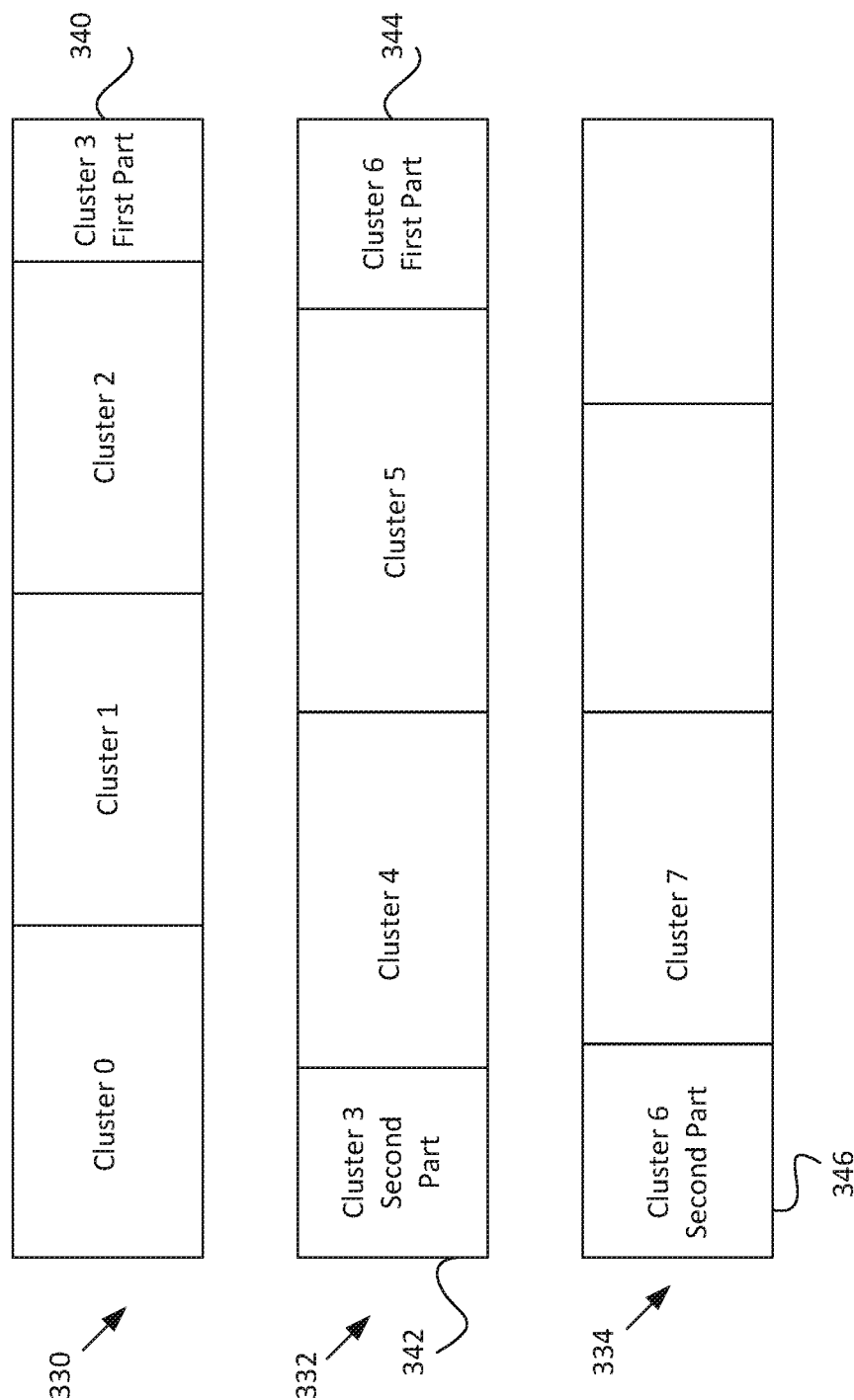
FIG. 3B is a diagram showing clusters of data stored in three pages of NAND flash memory, according to one embodiment of the invention.

FIG. 3B is a diagram showing clusters of data stored in three pages of NAND memory, according to one embodiment of the invention. For a read command calling for the retrieval of 32 KB of data, that data may be stored within three pages of NAND memory as shown in FIG. 3B. The ECC bits for each page of data, which in the FIG. 3B embodiment are stored in the spare area and may also be stored in the user data area of the page, are not shown for ease of illustration. A first NAND page 330 includes the first three 4 KB clusters (cluster 0, cluster 1, and cluster 2) and one portion of a fourth cluster (cluster 3 first part 340) of the requested data. A second NAND page 332 includes the second portion of the fourth cluster (cluster 3 second part 342), two full clusters (cluster 4, cluster 5) and another partial cluster (cluster 6 first part 344). In other words, NAND page 332 includes one partial cluster at the start of the page, two full clusters, and one partial cluster at the end of the page. A third NAND page 334 includes one partial cluster (cluster 6 second part 346) and one full cluster (cluster 7). NAND pages 330, 332, and 334 may be sequential pages in a single NAND device 116 or may be non-sequential pages stored in one or more NAND devices 116.

For an outstanding read command from the host to retrieve data that includes partial clusters, such as the eight clusters of data shown in FIG. 3A or the eight clusters of data shown in FIG. 3B, queue buffer manager 124 needs to track the completion of the retrieval of both portions of a split cluster. For example, queue buffer manager 124 needs to keep track of whether both parts 320, 322 of cluster 6 of FIG. 3A have been stored in ring buffer 136 to mark cluster 6 as retrieved in QBM bitmap 132. Page 312 and page 314 can be read from NAND devices 116 in any order and at different times. For example, page 314 may be read from one of NAND devices 116 at a time T1 and page 312 may be read from the same or a different one of NAND devices 116 at a significantly later time T2. Similarly, page 330 and page 332 of FIG. 3B can be read from NAND devices 116 in any order and at different times, such that page 332 including cluster 3 second part 342 may be read from one of NAND devices 116 before page 330 including cluster 3 first part 340 is read from one of NAND devices 116. Queue buffer manager 124 tracks the completion of clusters split across two separate NAND flash memory pages using PBC bitmap 134.

Figure 4:
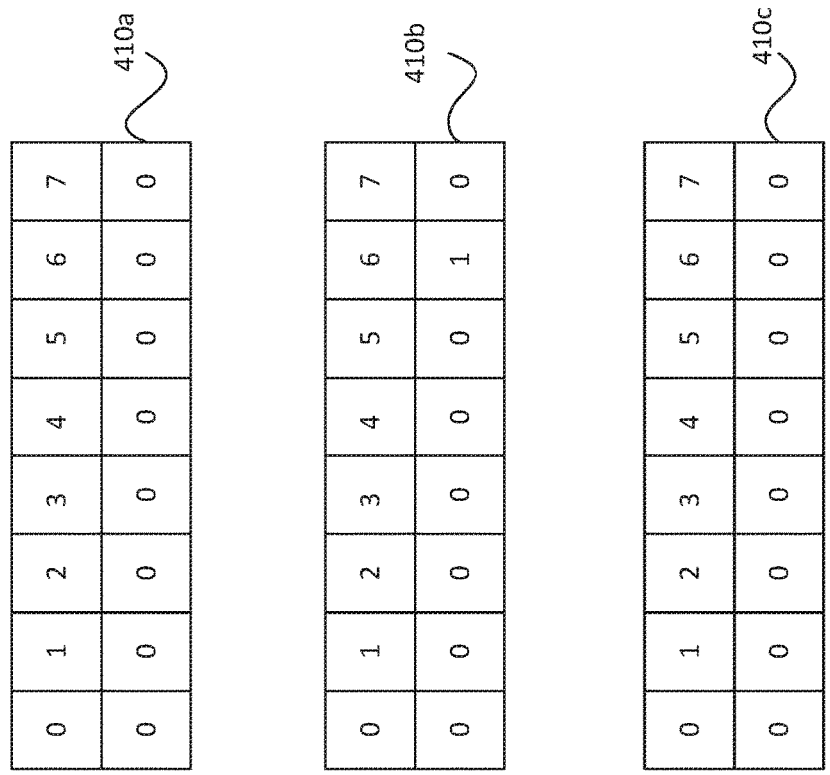
FIG. 4 is a diagram showing contents of one embodiment of a partial buffer count bitmap, according to the invention.

FIG. 4 is a diagram showing contents of one embodiment of PBC bitmap 134, according to the invention. When FTL/FIL 120 initiates a read from NAND devices 116, FTL/FIL 120 also allocates a number of 4 KB buffer portions in ring buffer 136 equal to the number of 4 KB clusters called for by the outstanding read command. For example, if the read command calls for 32 KB of data FTL/FIL 120 will assign eight buffer portions in ring buffer 136 to receive this data from NAND devices 116. PBC bitmap 134 preferably has a number of bits equal to the number of 4 KB buffer portions in ring buffer 136, which is significantly smaller than the number of bits in QBM bitmap 132. FIG. 4 shows the contents of a portion of PBC bitmap 134 that corresponds to the eight clusters of one outstanding read command calling for 32 KB of data for ease of reference; a PBC bitmap 134 having any appropriate number of bits is within the scope of the invention. When FTL/FIL 120 initiates a read operation to NAND devices 116, queue buffer manager 124 clears PBC bitmap 134 by setting all bits to "0." Portion 410a of PBC bitmap 134 shows that all bits have a value of "0." When a partial cluster of data is read from a NAND device 116 and stored in ring buffer 136, queue buffer manager 124 exclusive ORs (XORs) the current value of the bit in PBC bitmap 134 corresponding to that cluster with a logic value of "1" and stores the result in the same location in PBC bitmap 134. In another embodiment, queue buffer manager 124 changes the status of the bit in PBC bitmap 134 corresponding to that cluster by inverting the current value of the bit, i.e., changing a current logic "0" to a logic "1" or changing a current logic "1" to a logic "0." A result of "1" indicates that only one of the two partial clusters has been retrieved. A result of "0" indicates that both of the partial clusters have been retrieved. Portion 410b of PBC bitmap 134 shows that one of the portions (partial clusters) of cluster 6 has been read from NAND devices 116. The read portion could be either the first portion 320 or the second portion 322 of cluster 6. Queue buffer manager 124 does not need to keep track of the order in which partial clusters are retrieved; queue buffer manager 124 only needs to detect when both partial clusters have been read from NAND devices 116 and stored in ring buffer 136. Portion 410c of PBC bitmap 134 shows that both partial clusters of cluster 6 have been read from NAND devices 116; the value of the bit in PBC bitmap 134 corresponding to cluster 6 is "0." When both partial clusters have been retrieved, queue buffer manager 124 sets the bit in QBM bitmap 134 corresponding to that cluster to "1" to indicate that the full cluster has been retrieved and stored in ring buffer 136. By using an exclusive OR logical operation on the values stored in PBC bitmap 134, queue buffer manager 124 is able to determine when both portions of a split cluster have been retrieved from NAND devices 116 regardless of the order in which the portions were stored in ring buffer 136.

FIG. 5 is a diagram showing the contents of queue buffer management (QBM) registers 126, according to one embodiment of the invention. When a page read from NAND devices 116 completes, that is, the page of data has been stored in ring buffer 136, FTL/FIL 120 writes a completion word into QBM registers 126. Each QBM register 126 stores a 32-bit completion word that enables queue buffer manager 124 to update PBC bitmap 132 and QBM bitmap 134. Each completion word includes an 11-bit event queue (EQ) index, a 15-bit partial buffer offset, and a 6-bit partial buffer count. The EQ index is an identifier for the read command in event queue 122. Queue buffer manager 124 uses the EQ index value to retrieve the read command from event queue 122. The partial buffer offset indicates the number of partial buffers from the first buffer portion in ring buffer 136 allocated for that read command where a partial buffer appears in the page. The partial buffer count indicates the number of partial clusters returned in that page, where each full cluster return is counted as two partial clusters. The partial buffer count is a zero-based value where a value of "0" in the field indicates that one partial buffer was returned in that page read operation.

PBC registers 510, 512, and 514 contain completion words for pages 310, 312, and 314, respectively, shown in FIG. 3. PBC register 510 has an EQ index value of "1," a partial buffer offset value of "0," and a partial buffer count of "5." Page 310 includes clusters 0, 1, and 2, which were stored in partial buffer portions 0, 1, 2, 3, 4 & 5 allocated to that read command in ring buffer 136. The partial buffer offset value of "0" indicates that the data in page 310 was stored in ring buffer 136 starting at partial buffer 0 allocated to that read command. The partial buffer count value of "5" in register 510 indicates that page 310 includes six partial buffer portions of data (three whole clusters correspond to six partial buffer portions in ring buffer 136). PBC register 512 has an EQ index value of "1," a partial buffer offset value of "6," and a partial buffer count of "6." Page 312 includes clusters 3, 4, 5, and the first portion of cluster 6, which were stored in partial buffer portions 6, 7, 8, 9, 10, 11, and 12 allocated to that read command in ring buffer 136. The partial buffer offset value of "6" in register 512 indicates that page 312 was stored in ring buffer 136 starting at partial buffer 6 allocated to that read command. The partial buffer count value of "6" in register 512 indicates that the data read from page 312 includes seven partial buffer portions. PBC register 514 has an EQ index value of "1," a partial buffer offset value of "13," and a partial buffer count value of "2." Page 314 includes second portion of cluster 6 and cluster 7, which were stored in partial buffer portions 13, 14, and 15 allocated to that read command in ring buffer 136. The partial buffer offset value of "13" in register 516 indicates that page 314 was stored in ring buffer 136 starting at partial buffer 13 allocated to that read command. The partial buffer count value of "2" in register 516 indicates that data read from page 314 includes three partial buffer portions.

Figure 6:
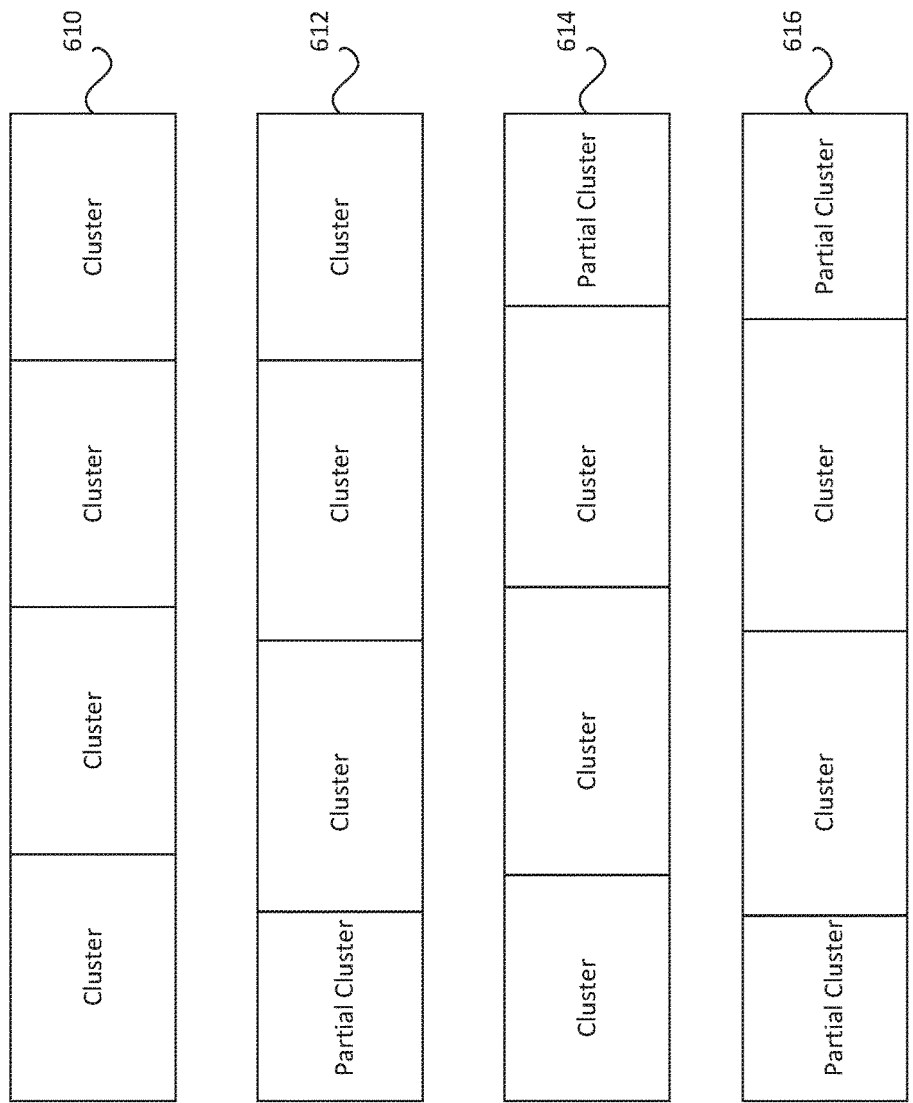
FIG. 6 is a diagram of data stored in pages of NAND flash memory, according to one embodiment of the invention.

FIG. 6 is a diagram of data stored in pages of NAND memory, according to one embodiment of the invention. FIG. 6 illustrates ways that full clusters and partial cluster portions can appear in pages of data in NAND devices 116. A page 610 includes four full clusters and no partial clusters. A page 612 includes a partial cluster at the start of the page followed by three full clusters. A page 614 includes three full clusters at the start of the page followed by one partial cluster. A page 616 includes one partial cluster at the start of the page, followed by two full clusters, and one partial cluster at the end of the page. As shown in FIG. 6, partial clusters may be located at the start or the end of a page in NAND devices 116, but not in the middle of a page in between two full clusters.

Figure 7:
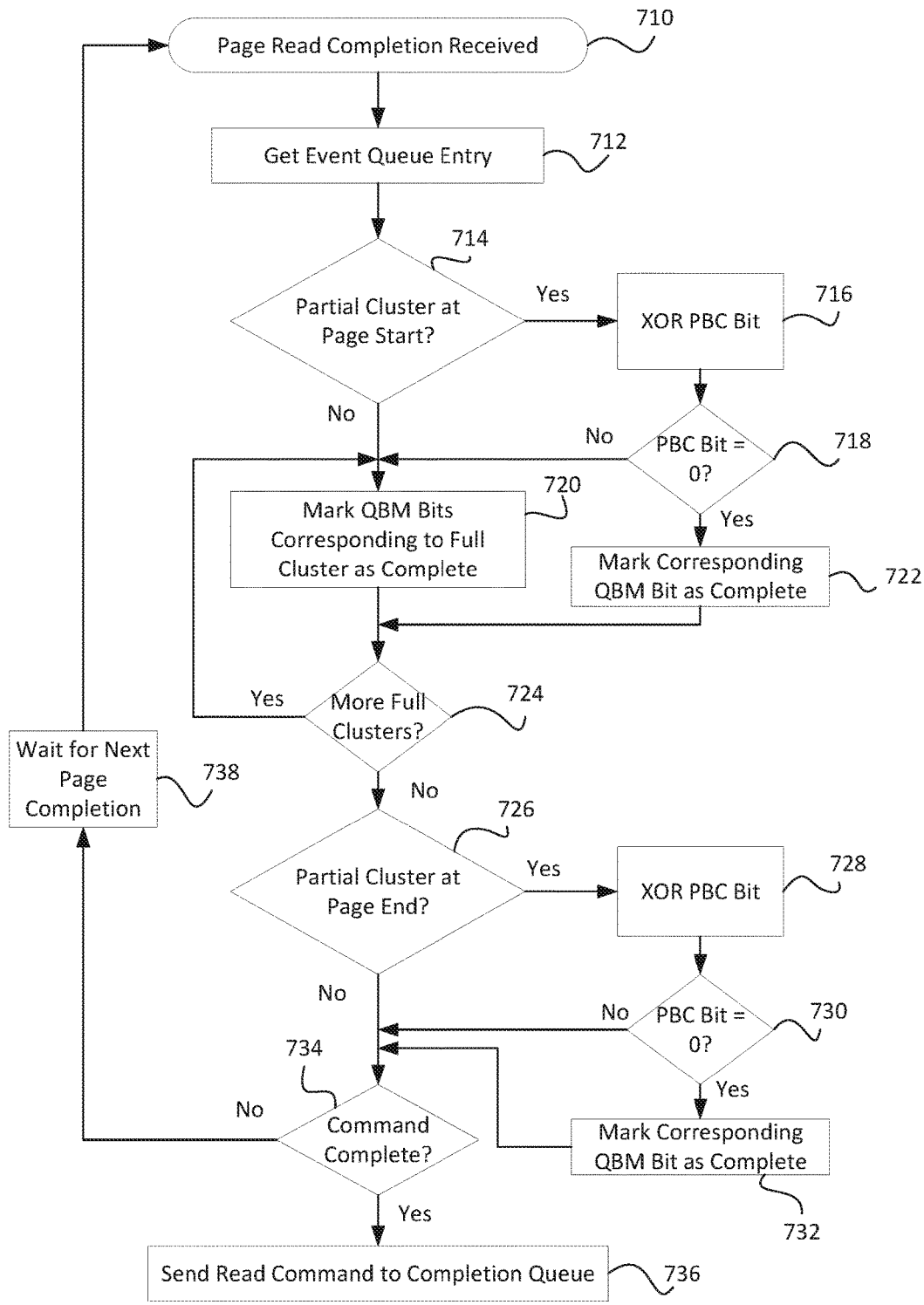
FIG. 7 is a flowchart of method steps for tracking completion of full and partial data clusters read from NAND flash memory to determine completion of a read command, according to one embodiment of the invention.

FIG. 7 is a flowchart of method steps for tracking completion of full and partial data clusters read from NAND flash memory to determine completion of a read command, according to one embodiment of the invention. In a step 710, FTL/FIL 120 writes a partial buffer completion word into QBM registers 126. In a step 712, queue buffer manager 124 retrieves the read command from event queue 122 corresponding to the event queue ID of the partial buffer completion word. In step 714, queue buffer manager 124 determines whether there is a partial cluster at the start of the retrieved page of data by reading the partial buffer offset field of the partial buffer completion word. If there is a partial cluster at the start of the retrieved page, the method continues with step 716, in which queue buffer manager 214 XOR's the current value of the corresponding bit in PBC bitmap 134 with a logic "1" and stores the result in the same location in PBC bitmap 134. In another embodiment, queue buffer manager 214 inverts the value of the corresponding bit in PBC bitmap 134 and stores the result in the same location in PBC bitmap 134. In step 718, queue buffer manager 214 determines whether the current value of the bit in PBC bitmap 134 is "0." If the bit in PBC bitmap 134 is "0," then in step 722 queue buffer manager 124 marks the appropriate bit in QBM bitmap 132 as complete.

Returning to step 714, if queue buffer manager 124 determines that there is not a partial cluster at the start of the retrieved page the method continues with step 720, in which queue buffer manager 124 marks as complete the appropriate bits for the full cluster in QBM bitmap 132. In step 724, queue buffer manager 124 determines if there are additional full clusters in the retrieved page. If so, the method returns to step 720. If not, in step 726 queue buffer manager 124 determines whether there is a partial cluster at the end of the retrieved page of data. If there is not a partial cluster at the end of the retrieved page, the method continues to step 734. If there is a partial cluster at the end of the retrieved page, the method continues with step 728, in which queue buffer manager 214 XOR's the current value of the corresponding bit in PBC bitmap 134 with a logic "1" and stores the result in the same location in PBC bitmap 134. In another embodiment, queue buffer manager 214 inverts the value of the corresponding bit in PBC bitmap 134 and stores the result in the same location in PBC bitmap 134. In step 730, queue buffer manager 214 determines whether the current value of the bit in PBC bitmap 134 is "0." If the bit in PBC bitmap 134 is "0," then in step 732 queue buffer manager 124 marks the appropriate bit in QBM bitmap 132 as complete. The method then continues with step 734, in which queue buffer manager 124 determines whether the read command from the host is complete, that is, whether all of the data called for by the read command has been stored in ring buffer 136. If the read command has been completed, the method continues to step 736, in which FTL/FIL 120 sends the read command to the completion queue of the host. If the read command has not been completed, then the method continues in step 738, in which queue buffer manager 124 waits to receive the next page completion from FTL/FIL 120.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, a machine may comprise a single instance or a plurality of machines, such plurality possibly encompassing multiple types of machines which together provide the indicated function. The machine types described in various embodiments are not meant to limit the possible types of machines that may be used in embodiments of aspects of the present invention, and other machines that may accomplish similar tasks may be implemented as well. Similarly, principles according to the present invention, and methods and systems that embody them, could be applied to other examples, which, even if not specifically described here in detail, would nevertheless be within the scope of the present invention.

What is claimed is:

1. A solid state storage drive comprising:
a plurality of flash memory devices configured to store a plurality of data clusters having a predefined data cluster size, and configured to store a first part of a first data cluster of the plurality of data clusters on a first page of flash memory and a second part of the first data cluster on a second page of flash memory;
a partial buffer completion bitmap stored in a memory, wherein each bit in the partial buffer completion bitmap corresponds to a location in a buffer configured to receive data clusters read from the plurality of flash memory devices; and
a controller configured to cause a page of data to be read from one of the plurality of flash memory devices, the page of data including either the first part of the first data cluster or the second part of the first data cluster, the controller including a queue buffer manager configured to change a status of a bit in the partial buffer completion bitmap when either the first part of the first data cluster or the second part of the first data cluster has been read from either the first page or the second page of flash memory and stored in the buffer.

2. The solid state storage drive of claim 1, wherein the plurality of flash memory devices is further configured to store a first part of a second data cluster on the second page of flash memory and a second part of a second data cluster on a third page of flash memory.

3. The solid state storage drive of claim 1, wherein the queue buffer manager changes the status of the bit in the partial buffer completion bitmap by performing an exclusive OR operation on the current value of the bit and a logic one value and storing the result as the updated value of the bit.

4. The solid state storage drive of claim 1, wherein the queue buffer manager is further configured to determine that both of the first part of the first data cluster and the second part of the first data cluster have been read from the first page and the second page of flash memory when a value of an updated bit in the partial buffer completion bitmap corresponds to a predetermined value.

5. The solid state storage drive of claim 1, wherein the queue buffer manager is further configured to initialize each bit in the partial buffer completion bitmap to a predetermined value at the start of a read operation from the plurality of flash memory devices.

6. The solid state storage drive of claim 1, further comprising at least one register configured to store a completion word that indicates whether a page of data read from one of the plurality of flash memory devices includes the first part of the first data cluster or the second part of the first data cluster.

7. The solid state storage drive of claim 6, wherein the queue buffer manager is configured to read the completion word to determine when either the first part of the first data cluster or the second part of the first data cluster has been read.

8. The solid state storage drive of claim 7, wherein the completion word includes a partial buffer offset value and a partial buffer count value.

9. The solid state storage drive of claim 1, wherein the queue buffer manager changes the status of the bit in the partial buffer completion bitmap by inverting the current value of the bit and storing the result as the updated value of the bit.

10. The solid state storage drive of claim 1, wherein the first page of flash memory is stored in one of the plurality of flash memory devices and the second page of flash memory is stored in a different one of the plurality of flash memory devices.

11. A method comprising:
reading a first page of data from one of a plurality of flash memory devices, the first page of data including either a first part of a first data cluster or a second part of the first data cluster, wherein the plurality of flash memory devices is configured to store a plurality of data clusters having a predefined data cluster size;
detecting a read completion for the first page of data read from the flash memory device;
determining that the first page of data read from the flash memory device includes either the first part of the first data cluster or the second part of the first data cluster; and
changing the status of a bit in a partial buffer completion bitmap, wherein each bit in the partial buffer completion bitmap corresponds to a location in a buffer configured to receive data clusters read from the plurality of flash memory devices.

12. The method of claim 11, wherein the first page of data includes the second part of the first data cluster and a first part of a second data cluster of the plurality of data clusters.

13. The method of claim 11, wherein changing the status of the bit in the partial buffer completion bitmap comprises performing an exclusive OR operation on the current value of the bit and a logic one value and storing the result as the updated value of the bit.

14. The method of claim 11, further comprising
determining that both the first part of the first data cluster and the second part of the first data cluster have been read from one or more of the plurality of flash memory devices when a value of an updated bit in the partial buffer completion bitmap corresponds to a predetermined value.

15. The method of claim 11, further comprising
initializing each bit in the partial buffer completion bitmap to a predetermined value at the start of a read operation from the plurality of flash memory devices.

16. The method of claim 11, wherein determining whether the first page of data read from the flash memory device includes either the first part of the first data cluster or the second part of the first data cluster comprises reading a completion word for the page of data.

17. The method of claim 16, wherein the completion word includes a partial buffer offset value and a partial buffer count value.

18. The method of claim 11, further comprising
reading a second page of data from one of the plurality of flash memory devices, the second page of data including either the first part of the first data cluster or the second part of the first data cluster;
detecting a read completion for the second page of data read from the flash memory device;
determining that the second page of data read from the flash memory device includes either the first part of the first data cluster or the second part of the first data cluster; and
changing the status of the bit in the partial buffer completion bitmap.

19. The method of claim 18, wherein the first page of data is read from a first one of the plurality of flash memory devices and the second page of data is read from a second one of the plurality of flash memory devices.

20. The method of claim 11, wherein changing the status of the bit in the partial buffer completion bitmap comprises inverting the current value of the bit and storing the result as the updated value of the bit.

* * * * *